(12) United States Patent
Shimizu

(10) Patent No.: US 11,573,916 B2
(45) Date of Patent: Feb. 7, 2023

(54) APPARATUSES AND METHODS FOR WRITING DATA TO A MEMORY

(71) Applicant: MICRON TECHNOLOGY, INC., Boise, ID (US)

(72) Inventor: Atsushi Shimizu, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/447,347

(22) Filed: Sep. 10, 2021

(65) Prior Publication Data

US 2021/0406208 A1  Dec. 30, 2021

Related U.S. Application Data

(62) Division of application No. 16/664,002, filed on Oct. 25, 2019, now Pat. No. 11,144,483.

(51) Int. Cl.
| | |
|---|---|
| G11C 7/00 | (2006.01) |
| G06F 13/16 | (2006.01) |
| G06F 13/28 | (2006.01) |
| G11C 29/42 | (2006.01) |
| G06F 11/18 | (2006.01) |
| G11C 11/409 | (2006.01) |
| G06F 11/10 | (2006.01) |

(52) U.S. Cl.
CPC ...... *G06F 13/1689* (2013.01); *G06F 11/1044* (2013.01); *G06F 11/18* (2013.01); *G06F 13/28* (2013.01); *G11C 11/409* (2013.01); *G11C 29/42* (2013.01)

(58) Field of Classification Search
CPC .. G06F 13/1689; G06F 11/1044; G06F 11/18; G06F 13/28; G11C 11/409; G11C 29/42

USPC .................................. 365/189.011; 711/154
See application file for complete search history.

(56) References Cited

U.S. PATENT DOCUMENTS

| | | | |
|---|---|---|---|
| 5,245,573 A | 9/1993 | Nakaoka | |
| 5,659,690 A * | 8/1997 | Stuber | ................... G06F 13/385 |
| | | | 710/311 |
| 5,903,582 A | 5/1999 | Miyazaki | |
| 6,396,746 B2 | 5/2002 | Ikeda | |
| 6,535,965 B1 | 3/2003 | Ikeda et al. | |
| 7,643,334 B1 | 1/2010 | Lee et al. | |

(Continued)

FOREIGN PATENT DOCUMENTS

WO   2021080746 A1   4/2021

OTHER PUBLICATIONS

U.S. Appl. No. 16/664,002, titled "Apparatuses and Methods for Writing Data to a Memory" filed Oct. 25, 2019, pp. all.

(Continued)

*Primary Examiner* — Viet Q Nguyen
(74) *Attorney, Agent, or Firm* — Dorsey & Whitney LLP

(57) ABSTRACT

Apparatuses and methods for writing data to a memory array are disclosed. When data is duplicative across multiple data lines, data may be transferred across a single line of a bus rather than driving the duplicative data across all of the data lines. The data from the single data line may be provided to the write amplifiers of the additional data lines to provide the data from all of the data lines to be written to the memory. In some examples, error correction may be performed on data from the single data line rather than all of the data lines.

20 Claims, 9 Drawing Sheets

(56) References Cited

U.S. PATENT DOCUMENTS

| | | |
|---|---|---|
| 8,509,020 B2 | 8/2013 | Kajigaya |
| 8,988,966 B2 | 3/2015 | Kwak |
| 10,514,983 B2 | 12/2019 | Eichmeyer et al. |
| 11,144,483 B2 * | 10/2021 | Shimizu ............... G11C 7/1096 |
| 2001/0017787 A1 | 8/2001 | Ikeda |
| 2002/0004921 A1 | 1/2002 | Muranaka et al. |
| 2002/0176447 A1 | 11/2002 | Marx et al. |
| 2003/0007403 A1 | 1/2003 | Kitamoto et al. |
| 2003/0056134 A1 | 3/2003 | Kanapathippillai et al. |
| 2003/0135699 A1 | 7/2003 | Matsuzaki et al. |
| 2003/0169631 A1 | 9/2003 | Hidaka |
| 2005/0162912 A1 * | 7/2005 | Roohparvar ......... G11C 16/102 |
| | | 365/185.11 |
| 2007/0071130 A1 | 3/2007 | Salto et al. |
| 2012/0131309 A1 * | 5/2012 | Johnson ................... G06F 8/40 |
| | | 712/E9.004 |
| 2017/0249097 A1 | 8/2017 | Eguchi |
| 2021/0124699 A1 | 4/2021 | Shimizu |

OTHER PUBLICATIONS

ISR/WO dated Jan. 12, 2021 for PCT Application No. PCT/US2020/053120, pp. all.
PCT Patent Application PCT/US20/53120 titled "Apparatuses and Methods for Writing Data To a Memory" filed Sep. 28, 2020, pp. all.

* cited by examiner

APPARATUSES AND METHODS FOR WRITING DATA TO A MEMORY

CROSS REFERENCE TO RELATED APPLICATION(S)

This application is a divisional of U.S. patent application Ser. No. 16/664,002 filed Oct. 25, 2019 and issued as U.S. Pat. No. 11,144,483 on Oct. 12, 2021. The aforementioned application, and issued patent, is incorporated herein by reference, in its entirety, for any purpose.

BACKGROUND

Electronic memories are used in many electronic systems to store information, for example, in electronic systems such as a mobile phone, a tablet, a computer, a server, as well as electronic systems including a processor or having a need to store information. The memory may be controlled through memory commands, such as write commands and read commands, which are received by the memory over a command bus. The information to be stored may be written to the memory using write commands, and retrieved at a later time by reading the information from the memory using read commands.

Information may be provided to and from the memory via multiple lines. While multiple lines allow information to be written to and read from the memory in parallel, driving multiple lines may consume more power than a single line.

DETAILED DESCRIPTION

Certain details are described to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

As described previously, information may be provided to and from a memory via multiple lines (e.g., data lines), which may allow information to be written to and read from the memory in parallel. In many cases, the information to be written to the memory is duplicative or has duplicative portions across the multiple lines. For example, one or more bytes to be provided to the memory may be the same data across at least some of the multiple lines. According to principles of the present disclosure, in cases where the information is duplicative across multiple lines, the information may be provided to the memory via one of the lines. This may reduce the number of lines that need to be driven when writing information to the memory. Reducing the number of lines that are driven during a write operation may reduce power consumption by the memory in some applications.

Figure 1:
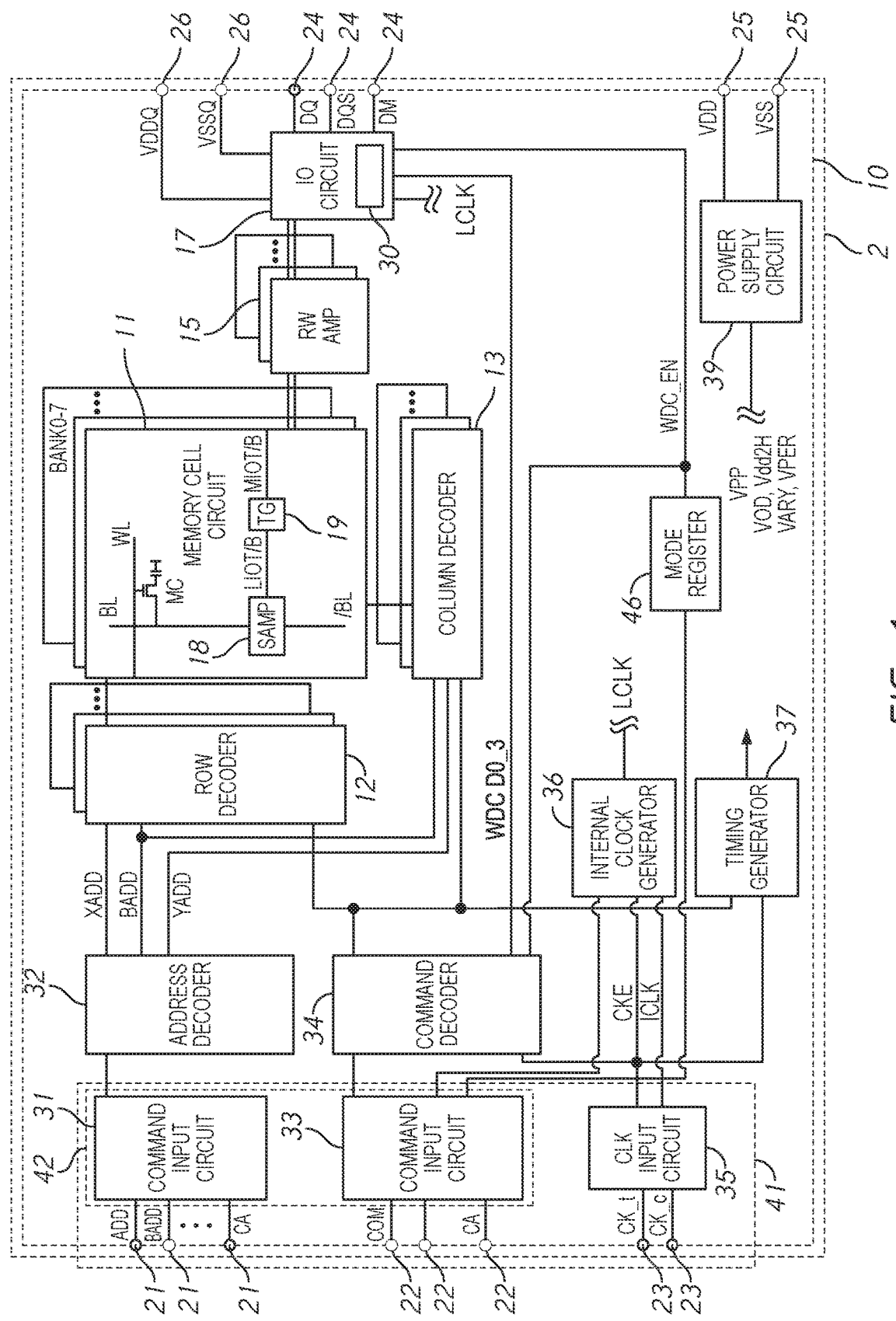
FIG. 1 is a block diagram of a semiconductor device according to an embodiment of the disclosure.

FIG. 1 is a block diagram of a semiconductor device 10 according to an embodiment of the disclosure. The semiconductor device 10 may be a memory (e.g., LPDDR5 SDRAM) integrated into a single semiconductor chip, for example. The semiconductor device 10 may be mounted on an external substrate 2, for example, a memory module substrate, a mother board or the like.

In the example shown in FIG. 1, the semiconductor device 10 includes a memory cell array 11. The memory cell array 11 includes a plurality of banks BANK0-7. More or fewer banks may be included in the memory cell array 11 in other examples. Each bank may include a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 12 and the selection of the bit line BL is performed by a column decoder 13. Sense amplifiers (SAMP) 18 are coupled to corresponding bit lines BL and/BL and coupled to local I/O line pairs LIOT/B. Local IO line pairs LIOT/B are coupled to main IO line pairs MIOT/B via transfer gates TG 19 which function as switches.

Read data from the bit line BL or/BL is amplified by the sense amplifier 18, and provided to transfer gate 19 over complementary local data lines LIOT/B. The transfer gate 19 may act as a switch to form a conductive path between the appropriate LIOT/B and appropriate shared main data lines MIOT/B. Read data may pass from the local data lines LIOT/B to the main data lines MIOT/B via a conductive path provided by the transfer gate 119 to a read/write amplifier 15, which provides the data to an IO circuit 17. Write data received from IO circuit 17 is output from the read/write amplifier 15 and provided to the sense amplifier 18 over the complementary main data lines MIOT/B, the transfer gate 19, and the complementary local data lines LIOT/B, and written in the memory cell MC coupled to the bit line BL or/BL.

Turning to the explanation of a plurality of external terminals included in the semiconductor device 10, the plurality of external terminals includes address terminals 21, command terminals 22, clock terminals 23, data terminals 24, and power supply terminals 25 and 26. An input signal block 41 may include the address terminals 21, the command terminals 22 and the clock terminals 23. A data interface includes the data terminals 24. The data terminals 24 may be coupled to output buffers for read operations of memories. Alternatively, the data terminals 24 may be coupled to input buffers for read/write access of the memories that will be later described. FIG. 1 shows an example of dynamic random access memory (DRAM), however, any device having external terminals for signal input/output may be included as the external terminals of embodiments of the disclosure.

The address terminals 21 are supplied with an address signal ADD and a bank address signal BADD which are provided to an address input circuit 31. The address may be provided by the address input circuit 31 to an address decoder 32. The command terminals 22 are supplied with a command signal COM. The command signal COM may include one or more separate signals. The command signal COM input to the command terminals 21 is provided to a command input circuit 33. The command input circuit 33 may provide the command signal COM to a command decoder 34.

Alternatively, the address terminals 21 and command terminals 22 may be combined command/address terminals configured to provide command and address signals CA to a command/address input circuit 42. In this embodiment, the command/address input circuit 42 receives the CA signals at the command/address terminals and provides address signals and provides internal command signals to the address decoder 32 and the command decoder 34, respectively. The address signals and command signals may be based on the combination of values of the CA signals received by the command/address input circuit 42.

The address signal ADD and the bank address signal BADD received are provided to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command decoder 34 decodes the command signal COM to generate various internal command signals. For example, the internal commands may include a row command signal to select a word line and a column command signal, such as a read command or a write command, to select a bit line, a mode register command provided to a mode register 46 to select a memory operating condition, such as a memory condition that enables write data copy operations, which will be described in more detail.

When a row activation command is issued and a bank address and a row address are timely supplied with the activation command, and a column address is timely supplied with a read command, read data is read from a memory cell MC in the memory cell array 11 designated by these row address and column address. The read data DQ is output externally from the data terminals 24 via a read/write amplifier 15 and an input/output circuit 17. Similarly, when the row activation command is issued and a bank address and a row address are timely supplied with the activation command, and a column address is timely supplied with the write command, the input/output circuit 17 may receive write data DQ at the data terminals 24. In some embodiments, a mask signal may also be provided at the DM terminal (also referred to as a DMI pin) during a write operation, which may indicate what write data provided at the data terminals 24 are written to the memory cell array 11. In some embodiments, the data terminals may be pads, e.g., DQ pads. The write data DQ is supplied via the input/output circuit 17 and the read/write amplifier 15 to the memory cell array 11 and written in the memory cell MC designated by the row address and the column address. The input/output circuit 17 may include input buffers and output buffers, according to at least one embodiment.

The clock terminals 23 are supplied with external clock signals CK_t and CK_c, respectively. These external clock signals CK_t and CK_c are complementary to each other and are supplied to a clock input circuit 35. The clock input circuit 35 receives the external clock signals CK_t and CK_c and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and may be used for output timing of the read data DQ via the DQS terminal (which may also be referred to as RDQS pin). The internal clock signal ICLK is also supplied to a timing generator 37 and thus various internal clock signals can be generated.

A mode register 46 may be used to define various modes of programmable operations and configurations of the semiconductor device 10. The mode register retains the stored information until it is reprogrammed, reset, or the semiconductor device 10 loses power. The mode register 46 may be programmed via a mode register write command. The mode register 46 may include one or more registers for storing information related to the different memory operations and configurations. For example, the mode register 46 may be used to set burst length, burst type, latency, frequency set point, enable programmable termination components, enable certain memory operations, as well as others. The mode register 46 may also be programmed with information that can be read to provide status information about the semiconductor device 10. For example, the mode register 46 may be used to provide a ready status, calibration status, as well as other status information. The information that is read may be programmed by circuits of the semiconductor device 10. The mode register 46 may be read via a mode register read command. Reading the mode register 46 allows information about the status of operations and configurations to be provided by the semiconductor device 10.

According to embodiments of the present disclosure, the mode register 46 may be programmed to enable write data copy operations. A write data copy operation may be performed in response to a write command. In a non-data copy write operation, data from all of the data terminals 24 (e.g., all of the DQ pads) are driven across data lines corresponding to each of the data terminals 24. The data lines may be included in one or more busses in the semiconductor device 10. The data from all the data lines may be stored in the memory array 11. In contrast, during a write data copy operation, data from a subset (e.g., one) of the data terminals 24 are driven across data lines corresponding to the subset of the data terminals 24. As will be described in more detail herein, the data from the subset of data lines may be duplicated at the read/write amplifier 15 to store the data in the memory.

When the mode register 46 is programmed to enable write data copy operations, the mode register 46 may provide a control signal WDC_EN that enables a write data copy control circuit 30, which may include one or more controllers. When the write data copy control circuit 30 is enabled by the control signal WDC_EN from the mode register 46, the write data copy control circuit 30 may respond to command signal WDC DC0_3 provided by the command decoder 34. In some examples, command signal WDC DC0_3 may be a multi-bit signal. Based on the command signal WDC DC0_3, the write data copy control circuit 30 may prevent some of the data lines, or portions thereof, from being driven when data is provided at the data terminals 24 during a write operation or a portion of a write operation. In some embodiments, such as the one shown in FIG. 1, the WDC_EN signal from the mode register 46 may be provided to the command decoder 34. In some embodiments, the WDC_EN signal may enable the command decoder 34 to generate the command signal WDC DC0_3.

The power supply terminals 25 are supplied with power supply voltages VDD and VSS. These power supply voltages VDD and VSS are supplied to an internal power supply circuit 39. The internal power supply circuit 39 generates various internal voltages VPP, VOD, VARY, VPERI, and Vdd2H. The Vdd2H voltage may be an internal voltage used as an output voltage to drive output signals. The internal voltage VPP is mainly used in the row decoder 12, the internal voltages VOD and VARY are mainly used in the sense amplifiers 18 included in the memory cell array 11, and the internal voltage VPERI is used in many other circuit blocks.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD and VSS that are supplied to the power supply terminals 25, respectively. However, as shown in FIG. 1, the dedicated power supply voltages VDDQ and VSSQ may be used for the input/output circuit 17 so that power supply noise generated by the input/output circuit 17 does not propagate to the other circuit blocks.

Figure 2:
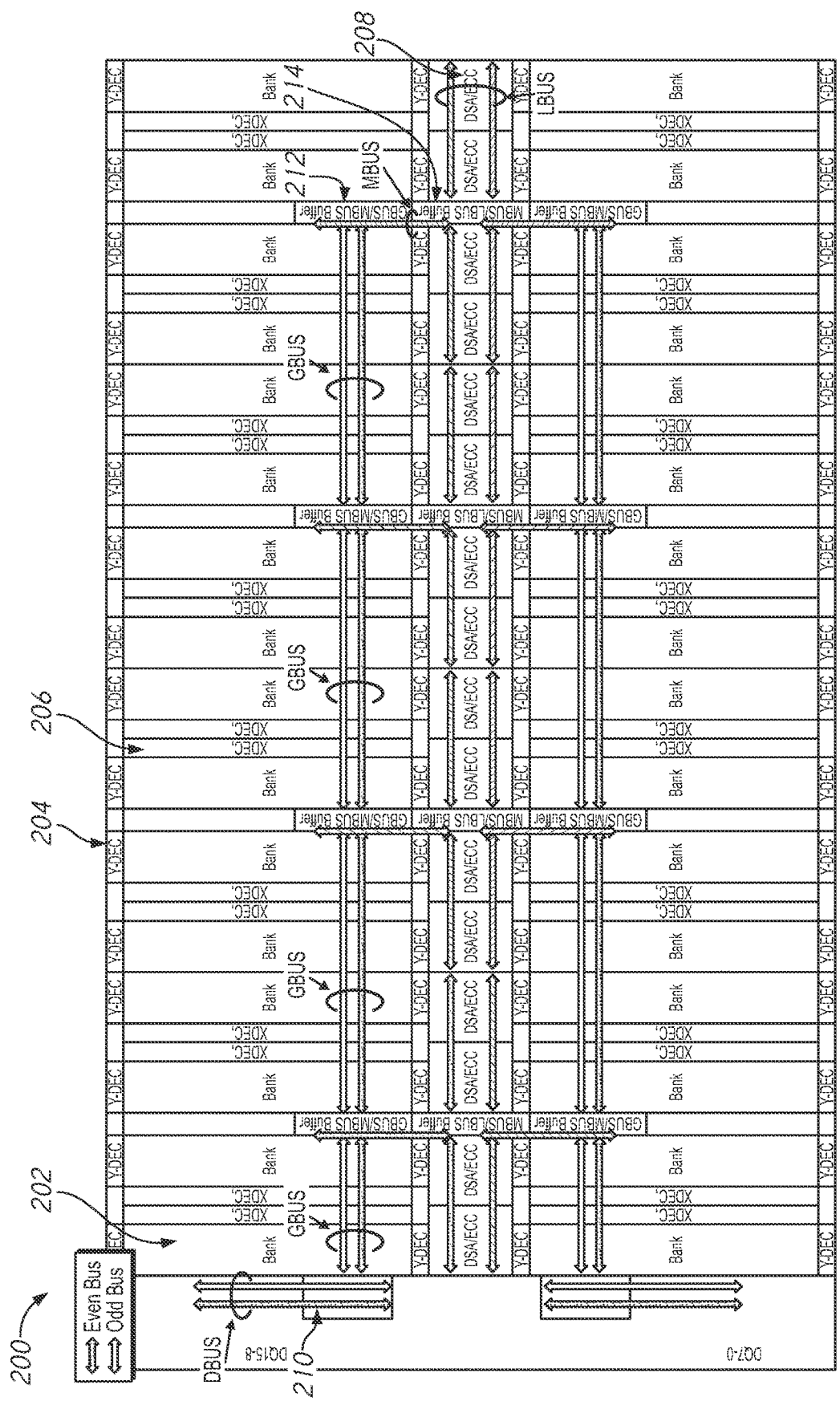
FIG. 2 is a chip layout diagram of a semiconductor device according to an embodiment of the disclosure.

FIG. 2 is a chip layout diagram of a semiconductor device 200 according to an embodiment of the disclosure. In some embodiments, semiconductor device 200 may include at least a portion of semiconductor device 10 shown in FIG. 1. Briefly, the semiconductor device 200 may include one or more banks 202 of a memory array (e.g., memory array 11) and row decoders 204 and column decoders 206 for each bank 202. In some embodiments, each bank 202 may have its own data sense amplifier and error correction code (DSA/ECC) circuit 208. In other embodiments, the DSA/ECC circuit 208 may be shared between two or more banks 202.

An example arrangement of data lines of the semiconductor device 200 is shown in FIG. 2. During a write operation, data may be received from DQ pads DQ15-0 and provided to a data bus DBUS. The data from each of the DQ pads DQ 15-0 may be serialized data (e.g., bits are provided one at a time in sequence). In some embodiments, the data from the DQ pads DQ15-0 may be de-serialized by de-serializer circuits (not shown in FIG. 2) prior to being provided to the data bus DBUS. The data bus DBUS may provide the data to an appropriate global data bus GBUS via a DBUS/GBUS buffer 210. The global data bus GBUS may provide the data to an appropriate main data bus MBUS via a GBUS/MBUS buffer 212. The main data bus MBUS may provide the data to an appropriate local data bus LBUS via an MBUS/LBUS buffer 214. The local data bus LBUS may provide the data to the appropriate DSA/ECC circuit 208 for storage in a desired bank 202. The appropriate MBUS and LBUS may be selected based, at least in part, on a bank address and/or column address provided with a write command (not shown). The transmission of the data across data lines through one or more busses and/or other components of the semiconductor device 200 to and from the memory array may be referred to as a data path.

In some situations, data provided on some or all of the DQ pads DQ15-0 may be the same for one or more periods of time. For example, one or more bytes of data may be the same across DQ7-0 and one or more bytes of data may be the same across DQ15-8. During a non-data copy write operation, the data across all of the DQ pads would be provided across all of the data buses DBUS, GBUS, MBUS, and LBUS to store the data in the memory. However, according to embodiments of the present disclosure, a write data copy operation could be executed when the data is duplicative across one or more data lines. In some embodiments of the disclosure, during a write data copy operation, data provided from one or more of the DQ pads may be provided to the data busses DBUS, GBUS, MBUS, and LBUS in some embodiments of the disclosure. The data from the one or more of the DQ pads may then be provided across all the data lines at the LBUS or the DSA/ECC circuit 208 so that all of the data from DQ15-0 is stored in the memory. For example, in some embodiments, data may be driven across a data line for one of the DQ pads of DQ7-0 and/or a data line for one of the DQ pads of DQ pads DQ15-8. This may reduce the number of data lines that need to be driven across the data busses DBUS, GBUS, MBUS, and/or LBUS. Reducing the number of data lines that need to be driven with data during a write operation may reduce power consumption of the semiconductor device 200 in some embodiments.

Figure 3:
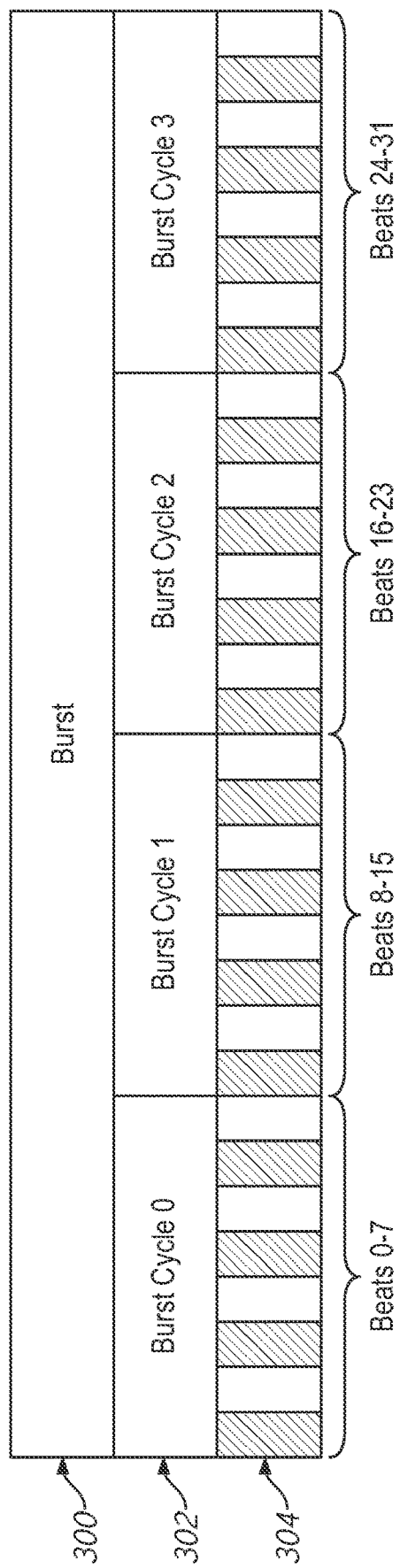
FIG. 3 is a block diagram of a data burst according to an embodiment of the disclosure.

In some embodiments, a write operation may have a burst structure. That is, a set number of bits of data to be written to the memory may be provided in series on one or more lines (e.g., DQ15-0) responsive to a write command. FIG. 3 is a block diagram of a burst 300 according to an embodiment of the disclosure. In some embodiments, the burst 300 may include a number of burst cycles 302. Each burst cycle 302 may include a number of beats 304. In some embodiments, a bit may be provided during each beat 304 of the burst cycle 302. In the examples described herein, a burst cycle 302 includes eight beats 304 and each burst 300 includes four burst cycles 302 for a total of 32 beats 304. Thus, 32 bits per line may be transmitted during a burst 300. However, the burst structure shown in FIG. 3 is provided only as an example. In other embodiments, the burst may have a different number of beats and/or may be divided into a different number of burst cycles.

While in some situations data may be the same across two or more lines for all 32 beats of a burst, it may be more common for data to be the same across two or more lines for a portion of the burst. Thus, if a write data copy operation required data to be the same across the two or more lines for the entire burst responsive to a write command, the power savings of the write copy operation may not be able to be utilized significantly. Accordingly, in some embodiments, a write operation may include a combination of a non-data copy write operations and a write data copy operations. For example, the write operation may include providing data to all of the lines (e.g., DQ pads) to be provided across all of the data buses (e.g., DBUS, GBUS, MBUS, LBUS) as during a non-data copy write operation for a portion of the burst responsive to a write command, and also include providing data to one or more of the lines to be copied and provided across one or more groups of the data buses. In some embodiments of the disclosure, the write command or other command may include information to designate portions of the burst as a non-data copy write operation or as a write data copy operation. For example, for a 32 bit burst over four burst cycles, the write command may include operands to designate each burst cycle as a non-data copy write operation or as a write data copy operation in some embodiments of the disclosure. Different combinations of burst length, burst cycles, and designating portions of the burst as a non-data copy write operation or as a write data copy operation are also included by other embodiments of the disclosure.

Figure 4:
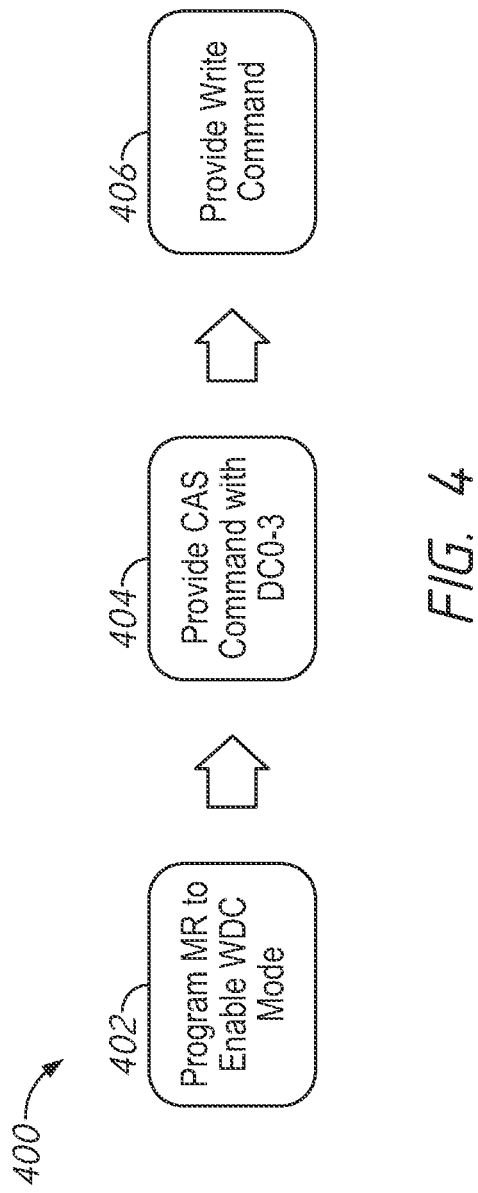
FIG. 4 is a flow chart of a method according to an embodiment of the disclosure.

FIG. 4 is a flow chart 400 of a method according to an embodiment of the disclosure. At block 402, a step of programming a mode register (MR) to enable a write data copy (WDC) mode may be performed. For example, a command provided by the command input circuit 33 may be used to program the mode register 46 to enable WDC mode of the semiconductor device 10. The WDC mode may enable write data copy operations responsive to a write command.

At block 404, a step of providing an access command CAS including operand bits DC0-3 may be performed. The operand bits DC0-3 may indicate which burst cycles of a burst for a write operation should be performed as a non-data copy write operation and which burst cycles of the burst should be performed as a write data copy operation. For example, in some embodiments, a "1" or high value for an operand bit may indicate a write data copy operation for the burst cycle and a "0" or low value for the operand bit may indicate a non-data copy write operation for the burst cycle. The operand bits DC0-3 includes four bits, each bit corresponding to one of four burst cycles of a burst. However, for bursts having a different number of burst cycles, a different number of operand bits may be included in the CAS command. In some embodiments, the operand bits DC0-3 may be provided to a write data copy control circuit (e.g., write data copy control circuit 30) as control signal WDC_DC0-3. Alternatively, in some embodiments, the operand bits DC0-3 may be provided with a write command at block 406 instead of with the CAS command at block 404.

At block 406, a step of providing a write command may be performed. The memory may then perform a write operation responsive to the write command. For some burst cycles, a non-data copy write operation may be performed and for other burst cycles, a write data copy operation may be performed, based, at least in part, on the values of the operand bits DC0-3.

Figure 5:
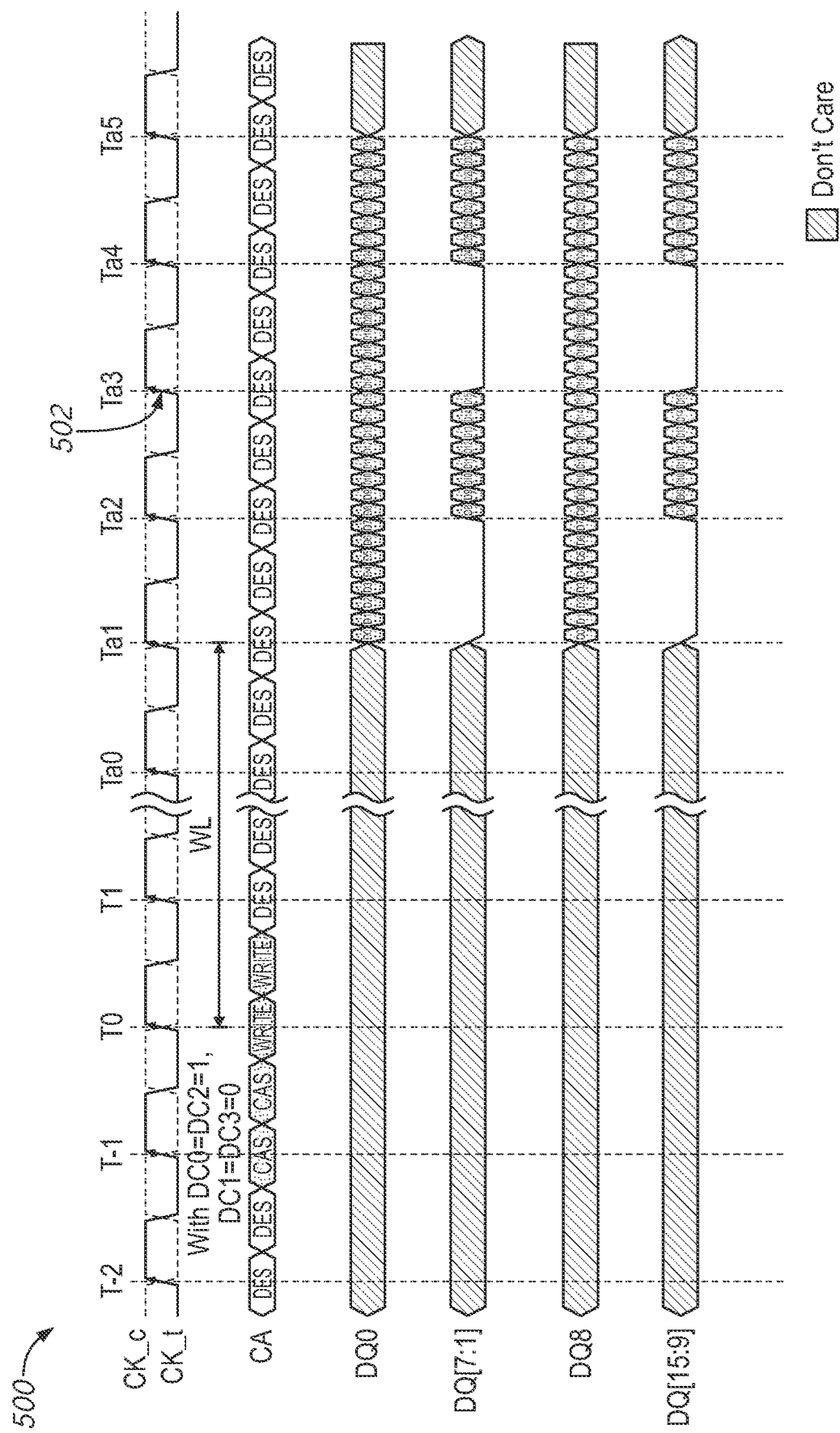
FIG. 5 is a timing diagram of a memory operation according to an embodiment of the disclosure.

FIG. 5 is a timing diagram 500 of a memory operation according to an embodiment of the disclosure. The timing diagram 500 illustrates an example of a manner in which a write operation including both write data copy and non-data copy write operations may be performed in some embodiments of the disclosure. In some embodiments, the memory operation depicted in timing diagram 500 may be performed by semiconductor device 10 and/or semiconductor device 200.

The first line of the timing diagram 500 illustrates differential clock signals CK_c and CK_t. The crossing points of differential clock signals CK_c and CK_t may be the rising and falling edges of a clock signal for timing memory operations. The rising edges of the differential clock signal are indicated by the arrows 502. The second line of the timing diagram 500 illustrates a command address signal CA. The third line illustrates a data line corresponding to DQ pad DQ0 (e.g., data line DQ0). The fourth line illustrates data lines corresponding to DQ pads DQ7-1 (e.g., data lines DQ7-1). A single time line is illustrated for data lines corresponding to DQ7-1 as the operation of these data lines may be substantially the same. The fifth line illustrates data line corresponding to DQ pad DQ8 (e.g., data line DQ8) and the sixth line illustrates data lines corresponding to data pads DQ15-9 (e.g., data lines DQ15-9). A single line is illustrated for data lines corresponding to DQ15-9 as the operation of these data lines may be substantially the same. While the memory operation illustrated in timing diagram 500 indicates a memory device having sixteen data lines DQ15-0, in other embodiments, the memory device performing the memory operation may have more or fewer data lines (e.g., 8, 32).

In the example operation shown in FIG. 5, a burst includes four burst cycles, where each of the burst cycles include eight beats. The data across data lines DQ7-0 are the same for a first burst cycle and a third burst cycle in the present example. That is, a first byte of data and a third byte of data across data lines DQ7-0 are the same. The data across data lines DQ15-8 are the same for the first burst cycle and third burst cycle. As noted previously, although the examples provided herein have a burst including 32 beats, in other embodiments, the burst may have a different number of beats and/or number of burst cycles.

At or around time T-1, a CAS command may be provided. The CAS command may include operand bits DC0-3. In some embodiments, the operand bits DC0-3 may be provided with a falling edge of the clock signal CK_t. In the example shown in FIG. 5, DC0=1, DC1=0, DC2=1, and DC3=0. In this example, the operand bits of the CAS command indicate that responsive to a subsequent write command, a write data copy operation should be performed for the first and third burst cycles of a burst and a non-data copy write operation should be performed for the second and fourth burst cycles of the burst.

At or around time T0, a write command may be provided. After a write latency time (WL), at or around a time Ta1, for the first burst cycle, which may be from about time Ta1 to time Ta2, a write data copy operation may be performed responsive to DC0=1. During the write data copy operation, data to be written to a memory may be provided from the data line DQ0 and data line DQ8 to the memory. Data provided from the data line DQ0 is copied and written to memory as data corresponding to data lines DQ7-1 and data provided from the data line DQ8 is written to memory as data corresponding to data lines DQ15-9. Data from data lines DQ7-1 and data lines DQ15-9 are not provided to the memory, even if such data is present at the corresponding DQ pads. In some embodiments of the disclosure, the data lines in the busses of the memory configured to receive data from DQ7-1 and DQ15-9 need not be driven during the first burst cycle.

For the second burst cycle, which may be from about time Ta2 to time Ta3, a non-data copy write operation may be performed responsive to DC1=0. During the write operation, data to be written to the memory may be provided from all the data lines DQ15-0 to the memory. All of the lines of data busses of the memory configured to receive data from all of the data lines DQ15-0 may be driven during the second burst cycle.

For the third burst cycle, which may be from about time Ta3 to time Ta4, a write data copy operation may be performed responsive to DC2=1. Similar to the first burst cycle, data from data lines DQ7-1 and data lines DQ15-9 are not provided to the memory. Rather, data from data line DQ0 is written to memory as data corresponding to data lines DQ7-1 and data provided from the data line DQ8 is written to memory as data corresponding to data lines DQ15-9. In some embodiments of the disclosure, the data busses of the memory configured to receive data from DQ7-1 and DQ15-9 need not be driven during the third burst cycle.

For the fourth burst cycle, which may be from about time Ta4 to time Ta5, a non-data copy write operation may be performed responsive to DC3=0. Similar to the second burst cycle, data to be written to the memory may be provided from all the data lines DQ15-0 to the memory. During the fourth burst cycle, all of the data busses of the memory configured to receive data from all of the data lines DQ15-0 may be driven.

Although the example shown in FIG. 5 shows a memory operation that alternates between non-data copy and write data copy operations with each burst cycle of a burst, any combination of operations may be performed. For example, a non-data copy write operation or a write data copy operation may be performed for all of the burst cycles. In another example, a write data copy operation may be performed for the first two burst cycles and a non-data copy write operation may be performed for the last two burst cycles. In a further example, a non-data copy write operation may be performed for the first burst cycle and write data copy operations may be performed for the remaining three burst cycles.

In the example shown in FIG. 5, one data line is used to provide data that is duplicative across eight data lines (e.g., DQ0 for DQ7-0 and DQ8 for DQ15-8). However, other combinations for providing duplicative data may be used. For example, one data line may be used to provide data that is duplicative across four data lines. In another example, one data line may be used to provide data that is duplicative across sixteen data lines. Moreover, in the example shown in FIG. 5, the operand bits DC0-3 are used to designate the type of write operation for burst cycles for data lines DQ7-0 and DQ15-8. In some embodiments of the disclosure, greater or fewer operand bits may be included in a CAS command to provide greater granularity for designating the type of write operation for a write command. For example, in some embodiments of the disclosure, a CAS command includes operand bits to designate the type of write operation for burst cycles for data lines DQ7-0 separately from burst cycles for data lines DQ15-8.

Figure 6:
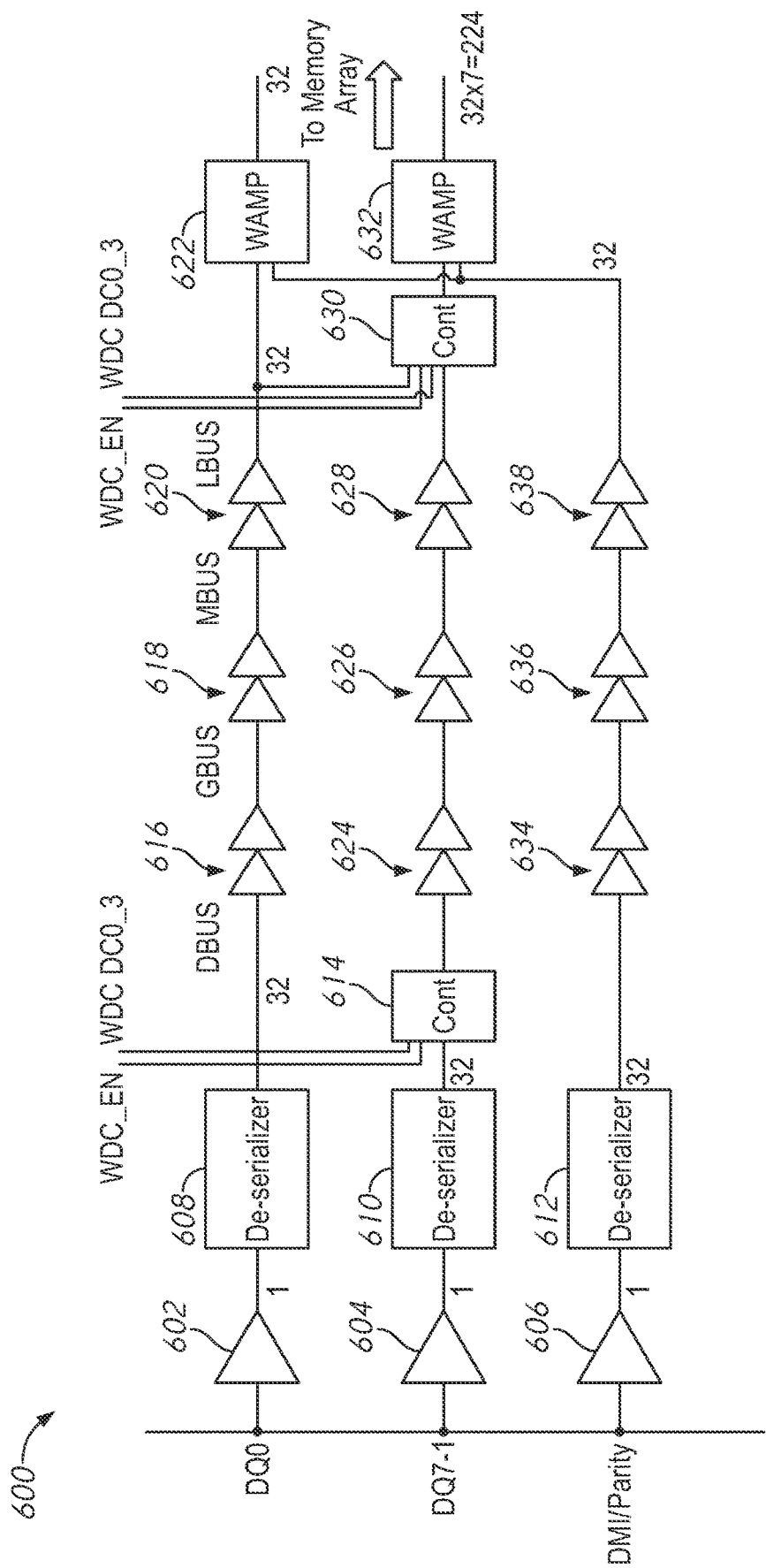
FIG. 6 is a schematic diagram of data paths between data pads and a memory cell array in a semiconductor device according to an embodiment of the disclosure.

FIG. 6 is a schematic diagram 600 of data paths between DQ pads to a memory cell array in a semiconductor device according to an embodiment of the disclosure. Select components of the semiconductor device are also shown for context. In some embodiments, the data paths and components shown in schematic diagram 600 may be included in semiconductor device 10 and/or semiconductor device 200. In the example shown in FIG. 6, there are eight data lines corresponding to eight DQ pads DQ7-0 (e.g., data lines DQ7-0). However, as shown in FIGS. 1, 2, and 5, in other embodiments, there may be other numbers of data lines (e.g., 4, 16, 32). It is understood that each data line DQ7-1 has a respective data path to the memory array. However, for simplicity, one path is illustrated for data lines DQ1-7 as the operation of the data paths for data lines DQ7-1 may be substantially the same.

As shown in FIG. 6, during a write operation (either a non-data copy write operation or a write data copy operation), data from DQ0 may be provided through a buffer 602 to a de-serializer 608. Data from DQ0 may be provided as a series of bits (e.g., 32 bits). The de-serializer 608 may receive the series of bits from DQ0 and output the bits in parallel onto a data bus DBUS. The width of the DBUS may be multiple bits and may match the width of the output of the de-serializer 608 in some embodiments. In the example where the de-serializer receives 32 bits, DBUS for DQ0 may be a 32-bit bus. Similar to what was described in reference to FIG. 2, the DBUS may provide the data to a global data bus GBUS via buffer 616. The GBUS may provide the data to an appropriate main data bus MBUS via buffer 618 and the MBUS may provide the data to an appropriate local data bus LBUS via buffer 620. The appropriate MBUS and LBUS may be selected, based at least in part, on a bank address and/or column address provided with a write command (not shown). The data may be provided from the LBUS to one or more write amplifiers 622. The write amplifiers 622 may write the data from the LBUS to memory cells of the memory array (not shown in FIG. 6).

Turning to DQ7-1, during a non-data copy write operation, data from DQ7-1 may be provided to the memory cells of the memory array in a similar manner as data provided from DQ0. That is, data from DQ7-1 may be provided via buffers 604 to de-serializers 610 to data buses DBUS and from the DBUS to a global data bus GBUS via buffers 624 and then to appropriate main data buses MBUS via buffers 626 and appropriate local data buses LBUS via buffers 628 to write amplifiers 632.

In some embodiments of the disclosure, there may be a controller 614 after the de-serializers 610. In some embodiments, the controller 614 may include multiple control circuits, for example, one for each data line corresponding to DQ7-1. In other embodiments, there may be multiple controllers 614, one for each data line corresponding to DQ7-1. In some embodiments, the controller 614 may be included in a write data copy control circuit, such as write data copy control circuit 30 shown in FIG. 1. In some embodiments, the controller 614 may be enabled by an active WDC_EN signal. In some embodiments, the WDC_EN signal may be provided by a mode register, such as mode register 46. When the controller 614 is disabled (e.g., WDC_EN is inactive), data from DQ7-1 passes along respective data paths during a write operation. When the controller 614 is enabled (e.g., WDC_EN is active), the controller 614 may be controlled based, at least in part, on control signal WDC DC0_3 received by the controller 614. In some embodiments, the WDC DC0_3 may be provided by a command decoder, such as command decoder 34. The control signal WDC DC0_3 may be based on operand bits included in an access command or write command, as previously described with reference to FIGS. 4 and 5.

The control signal WDC DC0_3 may indicate whether a non-data copy write operation or a write data copy operation is performed during a particular burst cycle of a burst responsive to a write command. When WDC DC0_3 indicates a non-data copy write operation is to be performed during the burst cycle, the controller 614 may remain inactive and data from DQ7-1 may be provided along respective data paths to the memory array. That is, the data lines of the DBUS, GBUS, MBUS, and LBUS data paths for DQ7-1 are driven to provide the data from all of the DQ pads during the burst cycle. When WDC DC0_3 indicates a write data copy operation is to be performed during the burst cycle, the controller 614 may be active and prevent the data lines of the DBUS, GBUS, MBUS, and/or LBUS for DQ7-1 from being driven for that burst cycle. In some embodiments, the controller 614 may maintain the data lines at a previous state (e.g., hold the data lines at a high or low state).

A controller 630 may be included along or after the LBUSs corresponding to DQ7-1. In some embodiments, the controller 630 may include multiple control circuits, for example, one for each data line corresponding to DQ7-1. In other embodiments, there may be multiple controllers 630, one for each data line corresponding to DQ7-1. In some embodiments, the controller 630 may be included in a write data copy control circuit, such as write data copy control circuit 30 shown in FIG. 1. In some embodiments, the controller 630 may be enabled by the active WDC_EN signal. When the controller 630 is disabled (e.g., WDC_EN is inactive), data from DQ7-1 passes along all of the LBUS to the write amplifiers 632 during a write operation. When the controller 630 is enabled (e.g., WDC_EN is active), the second controller 630 may be controlled based, at least in part, on control signal WDC DC0_3 received by the controller 630.

When WDC DC0_3 indicates a non-data copy write operation is to be performed during the burst cycle, data from DQ7-1 may be provided along respective data paths to the write amplifiers 632 to be stored in the memory cells of the memory array for the burst cycle. That is, the controller 630 may remain inactive. When WDC DC0_3 indicates a write data copy operation is to be performed during the burst cycle, the controller 630 is active and may receive the data from the LBUS corresponding to DQ0 and provide the data from the DQ0 LBUS to the write amplifiers 632 associated with DQ7-1 for writing to the memory array for that burst cycle.

Thus, in some embodiments, during a write copy data operation, the DBUS, GBUS, MBUS and/or LBUS of the data path corresponding to DQ0 need to be driven to transmit data for DQ7-0 to the memory array. This may allow for lower power consumption during some write operations.

Figure 9:
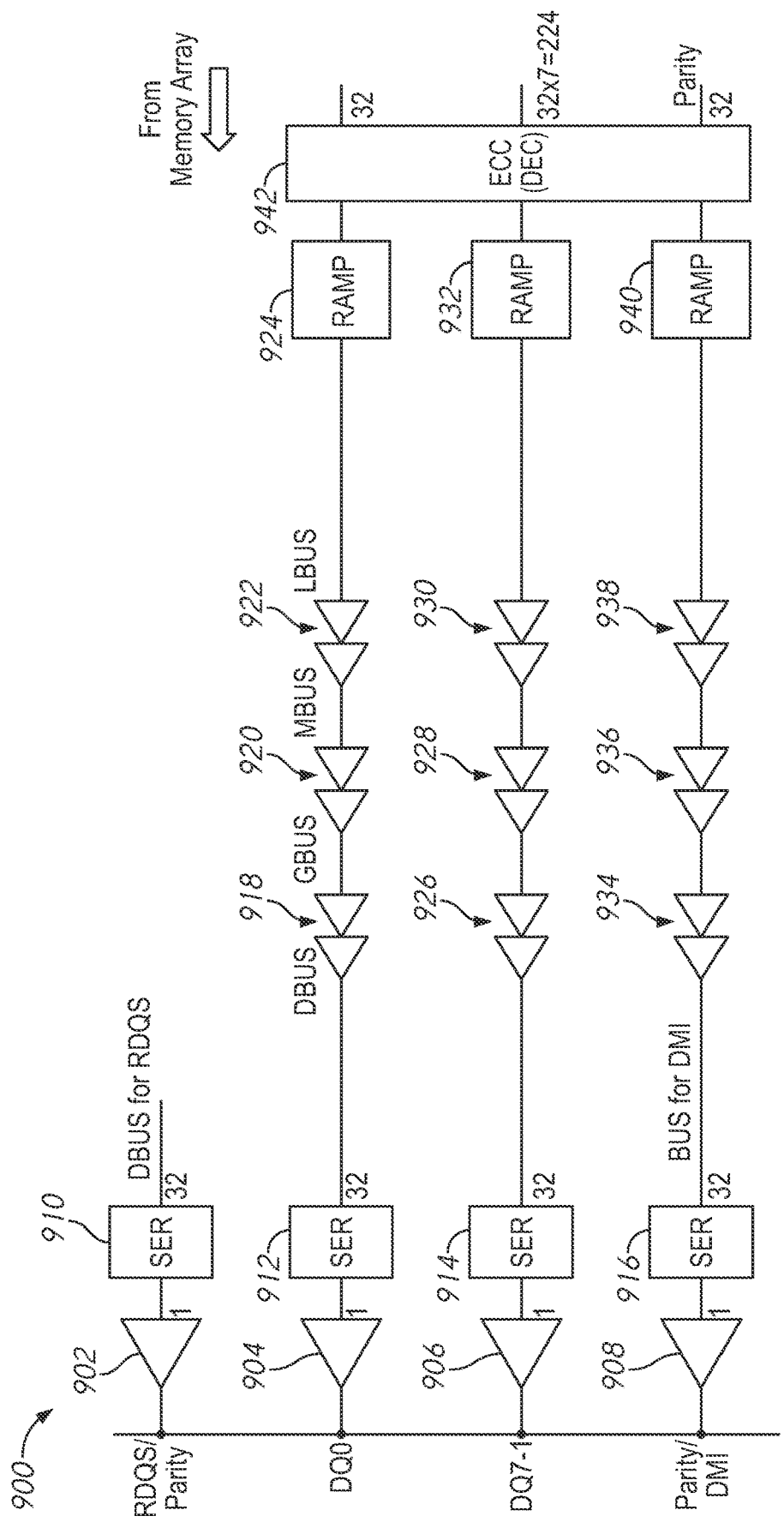
FIG. 9 is a schematic diagram of data paths between a memory cell array in a semiconductor device and data pads according to an embodiment of the disclosure.

In the embodiment shown in FIG. 6, the semiconductor device may further include a data mask inversion (DMI) pin. The DMI pin may provide a mask signal, which may include multiple bits provided in series. The mask signal from the DMI pin may be provided to the write amplifiers 622 and 632 in a similar manner as data provided from DQ0. That is, the mask signal may be provided via buffer 606 to de-serializer 612 to data buses DBUS and from the DBUS to a global data bus GBUS via buffer 634 and then to appropriate main data buses MBUS via buffer 636 and appropriate local data buses LBUS via buffers 638 to write amplifiers 622 and 632. When the mask signal is active, the write amplifiers 622 and 632 may be disabled. When disabled, the write amplifiers 622 and 632 may not write data from the LBUS to the memory cells during a write operation. That is, an active mask signal may cause the write amplifiers 622 and 632 to "ignore" data received. Thus, the existing data in the memory cells may be preserved. When the mask signal is inactive, the write amplifiers 622 and 632 may write data from the LBUS to the memory cells during a write operation. The mask signal may allow more targeted writing to the memory cell. That is, not every memory cell indicated by a write command needs to be written to during a write operation responsive to the write command. In some embodiments, the DMI pin may be used for other purposes during other memory operations. For example, the DMI pin may be used to provide parity data during a read operation as shown in FIG. 9.

Figure 7:
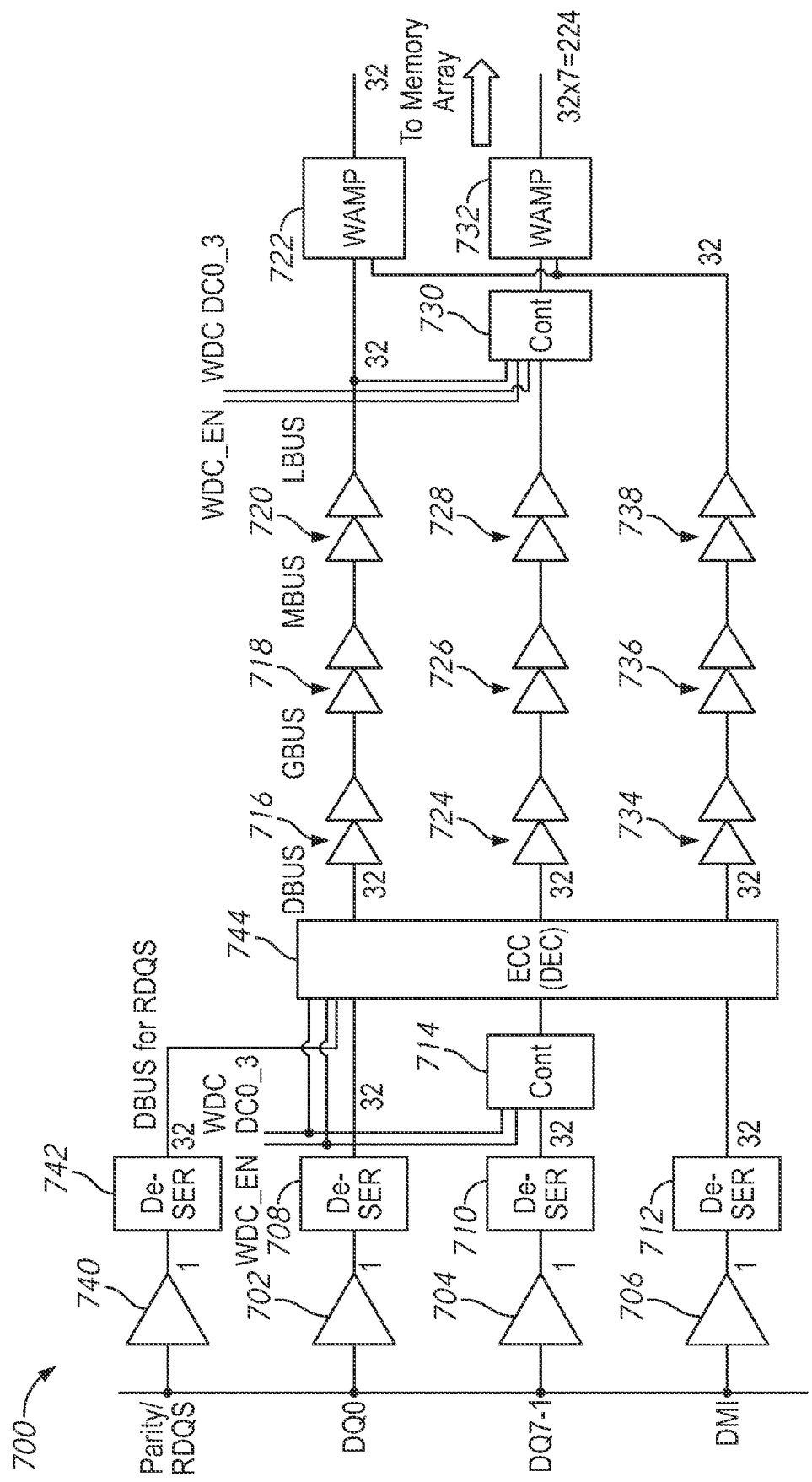
FIG. 7 is a schematic diagram of data paths between data pads and a memory cell array in a semiconductor device according to an embodiment of the disclosure.

FIG. 7 is a schematic diagram 700 of data paths between DQ pads to a memory cell array in a semiconductor device according to an embodiment of the disclosure. Select components of the semiconductor device are also shown for context. In some embodiments, the data paths and components shown in schematic diagram 700 may be included in semiconductor device 10 and/or semiconductor device 200. FIG. 7 shows many of the same data paths and components as those in FIG. 6 such as DQ7-0, DMI, de-serializers 708, 710, 712, buffers 702, 704, 706, 716, 718, 720, 724, 726, 728, 734, 736, 738, DBUS, GBUS, MBUS, LBUS, first and second controllers 714, 730, and write amplifiers 722, 732. These data paths and components may be arranged and operate in substantially the same manner as the corresponding data paths and components shown in FIG. 6. Accordingly, for the sake of brevity, these data paths and components and their operation will not be discussed again here.

In some embodiments, the semiconductor device may include error correction features. In the example shown in FIG. 7, an error correction code (ECC) circuit, more specifically, an ECC decoder circuit 744 may be included. In some embodiments, the ECC decoder circuit 744 may analyze data provided by de-serializers 708, 710, 712 from DQ7-0, DMI and provide corrected data to the data lines of the DBUS. In some embodiments, this may reduce erroneous data from being written to the memory array.

Parity data corresponding to the data provided on DQ7-0, DMI may be provided on a parity/RDQS pin to de-serializer 742 via buffer 740. The deserialized parity data may be provided to the ECC decoder circuit 744 via a data bus that is shared by the deserialized parity data and for a read data strobe (RDQS). The parity/RDQS pin may be a multi-use pin. During write operations, the parity/RDQS pin may be used to provide parity data. However, during a read operation, the parity/RDQS pin may be used for a clock signal to strobe data during a read operation as shown in FIG. 9.

In addition to the parity data, the ECC decoder circuit 744 may receive the WDC_EN signal from a mode register and the control signal WDC DC0_3 from a command decoder. When the WDC_EN signal is inactive and/or WDC DC0_3 indicates that a non-data copy write operation is to be performed for a burst cycle, the ECC decoder circuit 744 may perform error correction calculations on data provided from de-serializers 708 and 710 based on parity data received from de-serializer 742 for that burst cycle. The corrected data may be provided from the ECC decoder circuit 744 across all of the data paths (e.g., for DQ7-0) to the write amplifiers 722 and 732.

When the WDC_EN signal is active and control signal WDC DC0_3 indicates that a write data copy operation is to be performed for a burst cycle, the ECC decoder circuit 744 may perform error correction calculations on data provided from de-serializer 708 based on parity data received from de-serializer 742 for that burst cycle. That is, the ECC decoder circuit 744 may perform error correction on data provided from DQ0. The ECC decoder circuit 744 may provide the corrected data along the data path corresponding to DQ0 to write amplifier 722. However, as discussed with reference to FIG. 6, the second controller 730 may provide the corrected data from the data path for DQ0 to the write amplifiers 732. Thus, in some embodiments, during a write data copy operation, the ECC decoder circuit 744 may perform fewer error correction calculations, which may reduce power consumption in some applications.

In some embodiments, during a write data copy operation, the controller 714 may provide all zeros to the ECC decoder circuit 744 at inputs for DQ7-1. In these embodiments, the ECC decoder circuit 744 may perform calculations based on the DQ0 data and the all zero DQ1-7 inputs and the parity data provided from the parity/RDQS pin. In some embodiments, although the ECC decoder circuit 744 receives input on DQ1-7 (e.g., all zeros), buffers 724, 726, and 728 may remain inactive and controller 730 may copy the data from the data path for DQ0 to the write amplifiers 732. Thus, in some embodiments, there may be a power savings because buffers 724, 726, and 728 do not need to be driven.

Figure 8:
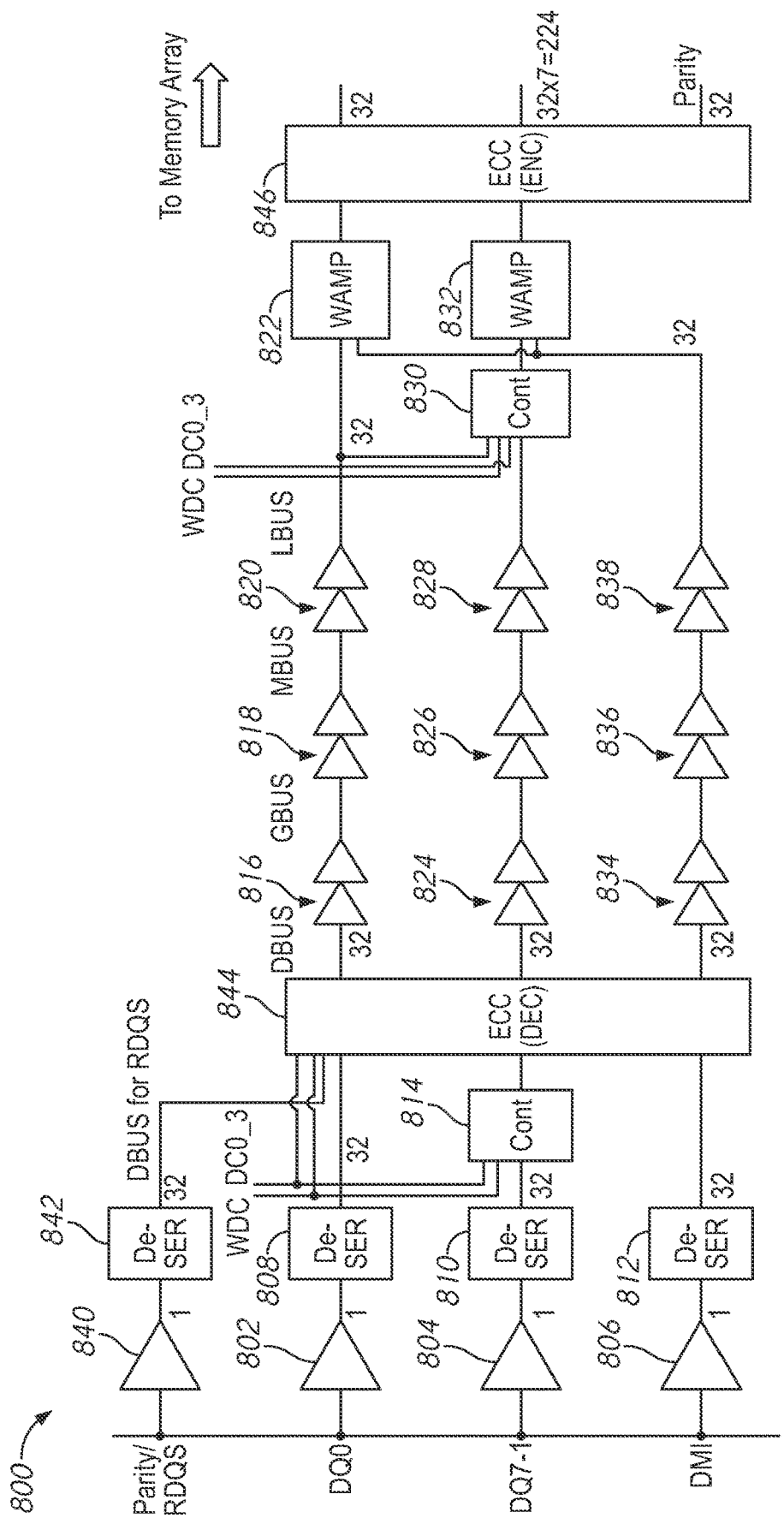
FIG. 8 is a schematic diagram of data paths between data pads and a memory cell array in a semiconductor device according to an embodiment of the disclosure.

FIG. 8 is a schematic diagram 800 of data paths between DQ pads to a memory cell array in a semiconductor device according to an embodiment of the disclosure. Select components of the semiconductor device are also shown for context. In some embodiments, the data paths and components shown in schematic diagram 800 may be included in semiconductor device 10 and/or semiconductor device 200. FIG. 8 shows many of the same data paths and components as those in FIGS. 6 and 7 such as DQ7-0, DMI, parity pin, de-serializers 808, 810, 812, 842, buffers 802, 804, 806, 816, 818, 820, 824, 826, 828, 834, 836, 838, 840, DBUS, GBUS, MBUS, LBUS, DBUS for RDQS, first and second controllers 814, 830, write amplifiers 822, 832, and ECC decoder circuit 844. These data paths and components may be arranged and operate in substantially the same manner as the corresponding data paths and components shown in FIGS. 6 and 7. Accordingly, for the sake of brevity, these data paths and components and their operation will not be discussed again here.

In some embodiments, the semiconductor device may include error correction features. In the example shown in FIG. 8, an error correction code (ECC) circuit, more specifically, an ECC encoder circuit 846 may be included. In some embodiments, the ECC encoder circuit 846 may receive data to be written to the memory array from write amplifiers 822 and 832 during a write operation and generate parity data corresponding to the data to be written to the memory array. The parity data generated by the ECC encoder circuit 846 may be provided to the memory array for storage (not shown). In some embodiments, the parity data may be stored separately from the data to be written to the memory array. In some embodiments, this may reduce erroneous data from being read from the memory array. As shown in FIG. 8, in some embodiments, the ECC encoder circuit 846 may operate in a same manner regardless of whether the write operation is a non-data copy write operation or a write data copy operation.

FIG. 9 is a schematic diagram 900 of data paths between a memory cell array in a semiconductor device to DQ pads according to an embodiment of the disclosure. Select components of the semiconductor device are also shown for context. In some embodiments, the data paths and components shown in schematic diagram 900 may be included in semiconductor device 10 and/or semiconductor device 200. In some embodiments, at least some of the data paths and components shown in schematic diagram 900 may be used in combination with the data paths and components shown in FIGS. 6, 7, and/or 8.

As shown in FIG. 9, during a read operation, data from the memory array (not shown) may be provided to an ECC decoder circuit 942 along with parity data. The ECC decoder circuit 942 may perform error correction calculations on the data from the memory array based on the parity data. The corrected data may be provided to read amplifiers 924 and 932. The parity data may be provided to read amplifier 940. The read amplifiers 924, 932, and 940 may provide the data and parity data to a local data bus LBUS. The LBUS may provide the data and parity data to a main data bus MBUS via buffers 922, 930, and 938. The MBUS may provide the data and parity data to a global data bus GBUS via buffers 920, 928, and 936. The GBUS may provide the data from the memory array to a data bus DBUS via buffers 918 and 926. The GBUS may provide the parity data to a data bus for the DMI pin.

The data from the memory may be serialized by serializers 912 and 914. The data may be provided to the appropriate data pads DQ7-0 via buffers 904 and 906. The parity data may be serialized by serializer 916 and provided to a parity pin via buffer 908. As noted in reference to FIG. 6, during write operations, the pin used to provide parity data during a read operation is used to provide a mask signal during write operations in some embodiments. The multi-use pin may reduce the number of pins and/or data lines required by the semiconductor device in some embodiments.

During a read operation, a read data strobe signal RDQS may be provided to a RDQS pin via serializer 910 and buffer 902. In some embodiments, the RDQS may be generated by an internal clock generator and/or timing generator (e.g., internal clock generator 36, timing generator 37). As discussed with reference to FIG. 7, in some embodiments, the pin used to provide the RDQS signal during read operations may be used to provide parity data during write operations. The multi-use pin may reduce the number of pins and/or data lines required by the semiconductor device in some embodiments.

As described herein, write data copy operations may reduce power consumption of a semiconductor device including a memory in some embodiments. In some embodiments, the repetitive features of data to be written to the memory may be taken advantage of to avoid driving one or more data lines, or portions thereof.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
   providing a mode register write command to a memory to program a mode register to enable write data copy operations;
   providing an operand bit for each burst cycle of a burst to the memory to indicate for each of the burst cycles of the burst whether a write data copy operation or a non-data copy write operation is to be performed;
   providing a write command to the memory; and
   providing data to be written to the memory to a plurality of data lines.

2. The method of claim 1, further comprising:
   holding a logic state of a subset of the plurality of data lines during a burst cycle of the burst when the operand bit for the burst cycle indicates a write data copy operation is to be performed.

3. The method of claim 1, wherein the operand bits are provided with an access command prior to the write command.

4. The method of claim 3, wherein the operand bits are provided on a falling clock edge during the access command.

5. The method of claim 1, wherein the burst includes four burst cycles and each burst cycle includes eight beats and wherein the operand bits comprise four bits.

6. The method of claim 1, wherein the operand bit for each burst cycle is provided with the write command.

7. The method of claim 1, further comprising providing an access command.

8. The method of claim 7, wherein the operand bit for each burst cycle is provided with the access command.

9. The method of claim 7, wherein the access command is provided prior to the write command.

10. A method comprising:
    receiving, at a mode register, a mode register write command and a value;
    writing the value to the mode register responsive to the mode register write command;

providing an enable signal from the mode register to a write data copy control circuit responsive to the value written to the mode register;
receiving an operand bit at the write data copy control circuit;
receiving a write command;
receiving data to be written to a memory array at at least one data terminal of a plurality of data terminals; and
responsive to the write command:
when the operand bit has a first value, performing a write data copy operation; and
when the operand bit has a second value, performing a non-data copy write operation.

11. The method of claim 10, further comprising receiving a plurality of operand bits, wherein each operand bit of the plurality of operand bits is associated with a burst cycle of a plurality of burst cycles.

12. The method of claim 11, wherein the plurality of burst cycles are included in a burst.

13. The method of claim 6, wherein performing the write data copy operation comprises:
copying data provided at the at least one data terminal to a plurality of data lines; and
writing the data from the plurality of data lines to the memory array.

14. The method of claim 10, further comprising:
receiving an active data mask signal; and
responsive to the active data mask signal, ignoring at least some of the data to be written to the memory array.

15. The method of claim 10, further comprising receiving parity data corresponding to the data to be written to the memory array.

16. A method comprising:
receiving at a first controller and a second controller an enable signal and an operand bit;
responsive to an active enable signal and the operand bit having a first value:
holding, with the first controller, at least one data line of a plurality of data lines at a first level; and
copying, with the second controller, data from at least one other data line to remaining ones of the plurality of data lines; and
responsive to an inactive enable signal or the operand having a second value:
permitting, with the first controller, the at least one data line to change logic levels.

17. The method of claim 16, further comprising:
writing the data from the plurality of data lines to a memory array.

18. The method of claim 16, wherein the enable signal is provided by a mode register.

19. The method of claim 16, wherein the operand bit is provided by a command decoder.

20. The method of claim 19, wherein the operand bit is provided responsive to an access command.

* * * * *